US010797205B2

(12) United States Patent
Li et al.

(10) Patent No.: US 10,797,205 B2
(45) Date of Patent: Oct. 6, 2020

(54) LIQUID CRYSTAL DISPLAY DEVICE AND QUANTUM DOT LED

(71) Applicant: Hisense Visual Technology Co., Ltd., Qingdao, Shandong (CN)

(72) Inventors: Fulin Li, Shandong (CN); Zhicheng Song, Shandong (CN)

(73) Assignee: HISENSE VISUAL TECHNOLOGY CO., LTD., Qingdao (CN)

( * ) Notice: Subject to any disclaimer, the term of this patent is extended or adjusted under 35 U.S.C. 154(b) by 0 days.

(21) Appl. No.: 16/727,694

(22) Filed: Dec. 26, 2019

(65) Prior Publication Data

US 2020/0144457 A1 May 7, 2020

Related U.S. Application Data

(63) Continuation of application No. PCT/CN2018/090106, filed on Jun. 6, 2018.

(30) Foreign Application Priority Data

Mar. 20, 2018 (CN) .......................... 2018 1 0228475

(51) Int. Cl.
*H01L 33/50* (2010.01)
*F21V 8/00* (2006.01)

(52) U.S. Cl.
CPC ............ *H01L 33/50* (2013.01); *G02B 6/0073* (2013.01)

(58) Field of Classification Search
CPC ................... H01L 33/50; H01L 33/504; G02F 2001/133624; G02F 2202/36; G02F 1/133615; G02F 2001/133614; G02F 1/133603
See application file for complete search history.

(56) References Cited

U.S. PATENT DOCUMENTS

| | | | | |
|---|---|---|---|---|
| 10,101,008 | B2 * | 10/2018 | Miyanaga | G02B 6/0073 |
| 2013/0265522 | A1 | 10/2013 | Jung et al. | |
| 2017/0122527 | A1 * | 5/2017 | Miyanaga | H01L 33/502 |

(Continued)

FOREIGN PATENT DOCUMENTS

| | | | |
|---|---|---|---|
| CN | 101253637 | A | 8/2008 |
| CN | 103597568 | A | 2/2014 |
| CN | 104521016 | A | 4/2015 |

(Continued)

OTHER PUBLICATIONS

International Search Report for corresponding PCT/CN2018/090106 application, dated Nov. 23, 2018.

*Primary Examiner* — Tracie Y Green
(74) *Attorney, Agent, or Firm* — Brinks Gilson & Lione

(57) ABSTRACT

Liquid crystal display device and quantum dot LED are provided. The fluorescent layer is arranged at the light-emitting side of the LED chip so that the light of first wavelength generated by the LED chip excites the fluorescent layer to generate the light of second wavelength, the light of first wavelength excites the first quantum dot material of the quantum dot layer to generate the light of third wavelength, the light of first wavelength and the light of second wavelength excite the second quantum dot material to generate the light of fourth wavelength, the third wavelength is shorter than the second wavelength, and the light of third wavelength and the light of second wavelength have the same color.

15 Claims, 8 Drawing Sheets

(56) References Cited

U.S. PATENT DOCUMENTS

| | | | | |
|---|---|---|---|---|
| 2020/0075817 | A1* | 3/2020 | Li | H01L 33/504 |
| 2020/0161509 | A1* | 5/2020 | Dabich, II | H01L 33/54 |

FOREIGN PATENT DOCUMENTS

| | | | |
|---|---|---|---|
| CN | 105093671 | A | 11/2015 |
| CN | 105374922 | A | 3/2016 |
| CN | 106773296 | A | 5/2017 |
| CN | 107340647 | A | 11/2017 |

* cited by examiner

LIQUID CRYSTAL DISPLAY DEVICE AND QUANTUM DOT LED

The present application is a continuation of International Application No. PCT/CN2018/090106, filed on Jun. 6, 2018, which claims priority to Chinese Patent Application No. 201810228475.4, filed with the Chinese Patent Office on Mar. 20, 2018, which are hereby incorporated by reference in their entireties.

FIELD

The disclosure relates to display technologies and particularly to a quantum dot Light Emitting Diode (LED) and liquid crystal display devices.

BACKGROUND

With the development of display technologies, various products having the display function are used in our daily life, and the liquid crystal display has become one of the current mainstream products in the display field.

Traditionally, the white LED in the backlight module is formed by the blue LED exciting yellow fluorescent powder or red and green fluorescent powder to mix into the white light, but cannot have a very high color gamut (generally between 70%-85% of National Television Standards Committee (NTSC) color gamut) due to a wider full width at half maxima (FWHM). For the above problem, the blue light is used to excite the quantum dot material to meet the high color gamut of the display device in the related art. The quantum dot material is consisted of the semiconductor nanometer material, the narrower wavelength band generates the denser light, and the quantum dot material has the special and excellent fluorescence emission property in the visible light region. Generally, the quantum dot film is encapsulated between two layers of water-oxygen barrier film, and the light source is the blue light source. The quantum dot film is excited to generate the red light and green light, and the blue light, red light and green light are mixed and converted into the white light. Another quantum dot LED is also used, where a quantum dot layer is arranged at the light-emitting side of the LED chip, and the blue light emitting from the LED chip excites the quantum dot material arranged in the quantum dot layer to generate the red and green light, so that finally the backlight module emits the white light. Furthermore, in order to meet the viewing experience of the user, the chromaticity coordinates of the liquid crystal television are generally designed as ($x=0.280\pm0.015$, $y=0.290\pm0.015$), wherein the red color mainly affects the magnitude of x in the chromaticity coordinates and the green color mainly affects the magnitude of y in the chromaticity coordinates. For the output spectrum of the quantum film used by the ordinary quantum dot backlight module, the ratio of peak intensity of the red light to peak intensity of green light is generally between 1:0.9~1:1.1.

SUMMARY

The present disclosure describes embodiments of liquid crystal display devices and quantum dot LED.

The present disclosure describes an embodiment of a liquid crystal display device. The liquid crystal device includes a quantum dot film, an optical film group and a backlight source. The backlight source includes an LED chip configured to generate light of first wavelength and a fluorescent layer arranged at a light-emitting side of the LED chip. The fluorescent layer is configured to be excited by the light of first wavelength to generate light of second wavelength. The quantum dot film includes a first quantum dot material and a second quantum dot material. The first quantum dot material is configured to be excited by the light of first wavelength to generate light of third wavelength. The second quantum dot material is configured to be excited by the light of first wavelength and the light of second wavelength to generate light of fourth wavelength. A portion of the light of first wavelength, the light of third wavelength and the light of fourth wavelength emits from the quantum dot film to the optical film group. The light of third wavelength and the light of second wavelength have the same color, and the third wavelength is shorter than the second wavelength.

The present disclosure describes an embodiment of a quantum dot LED. The quantum dot LED includes: a support with a cavity arranged therein, a quantum dot layer arranged on the top of the cavity, an LED chip arranged on the bottom of the cavity and configured to generate light of first wavelength, and a fluorescent layer arranged between the LED chip and the quantum dot layer. The fluorescent layer is configured to be excited by the light of first wavelength to generate light of second wavelength. The quantum dot layer includes a first quantum dot material and a second quantum dot material. The first quantum dot material is configured to be excited by the light of first wavelength to generate light of third wavelength. The second quantum dot material is configured to be excited by the light of first wavelength and the light of second wavelength to generate light of fourth wavelength. A portion of the light of first wavelength, the light of third wavelength and the light of fourth wavelength emits from a light-emitting side of the quantum dot layer. The light of third wavelength and the light of second wavelength have the same color, and the third wavelength is shorter than the second wavelength.

The present disclosure describes an embodiment of a liquid crystal display device. The liquid crystal display device includes a quantum dot LED. The quantum dot LED includes: a support with a cavity arranged therein, a quantum dot layer arranged on the top of the cavity, an LED chip arranged on the bottom of the cavity and configured to generate light of first wavelength, and a fluorescent layer arranged between the LED chip and the quantum dot layer. The fluorescent layer is configured to be excited by the light of first wavelength to generate light of second wavelength. The quantum dot layer includes a first quantum dot material and a second quantum dot material. The first quantum dot material is configured to be excited by the light of first wavelength to generate light of third wavelength. The second quantum dot material is configured to be excited by the light of first wavelength and the light of second wavelength to generate light of fourth wavelength. A portion of the light of first wavelength, the light of third wavelength and the light of fourth wavelength emits from a light-emitting side of the quantum dot layer. The light of third wavelength and the light of second wavelength have the same color, and the third wavelength is shorter than the second wavelength.

BRIEF DESCRIPTION OF THE DRAWINGS

In order to illustrate the embodiments of the disclosure more clearly, the drawings to be referenced in the description of the embodiments will be introduced below briefly. Obviously, the drawings below merely describe some embodiments of the disclosure, and other drawings can also be obtained by those ordinary skilled in the art according to these drawings without any inventive effort.

DETAILED DESCRIPTION

Figure 1A:
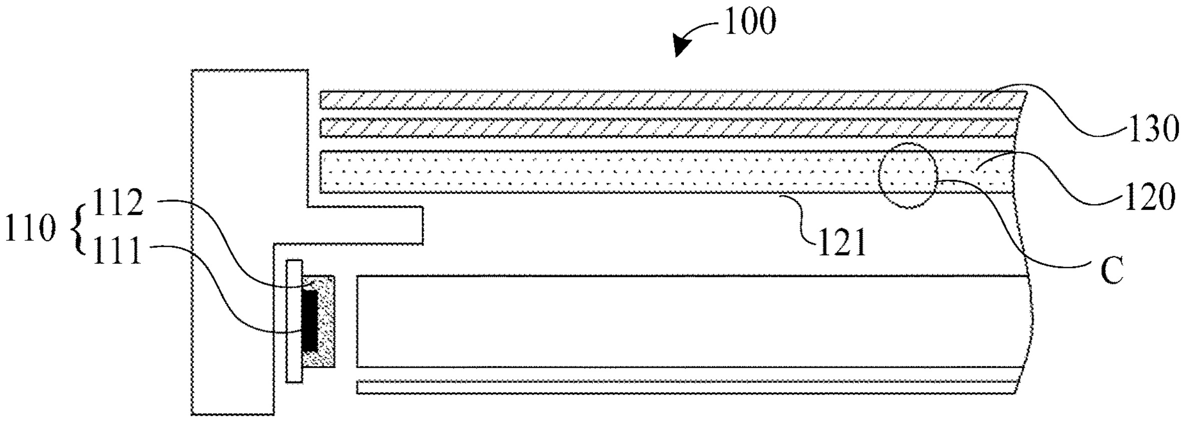
FIG. 1A is a schematic structural diagram of a liquid crystal display device in accordance with some embodiments of the disclosure.

The embodiments of the disclosure will be described below in combination with the drawings in the embodiments of the disclosure. Obviously, the described embodiments are merely a part of the embodiments of the disclosure but not all the embodiments. Based upon the embodiments in the disclosure, all of other embodiments obtained by those ordinary skilled in the art without inventive effort pertain to the protection scope of the disclosure. It should be noted that the examples of the embodiments are shown in the drawings, in which the same or similar numerals represent the same or similar components or the components having the same or similar functions. The embodiments with reference to the drawings are exemplary and intended to explain the disclosure, but should not construe as the limitations of the disclosure. The several specific embodiments below can be combined with each other, and some of the processes may be omitted in some embodiments.

Figure 1B:
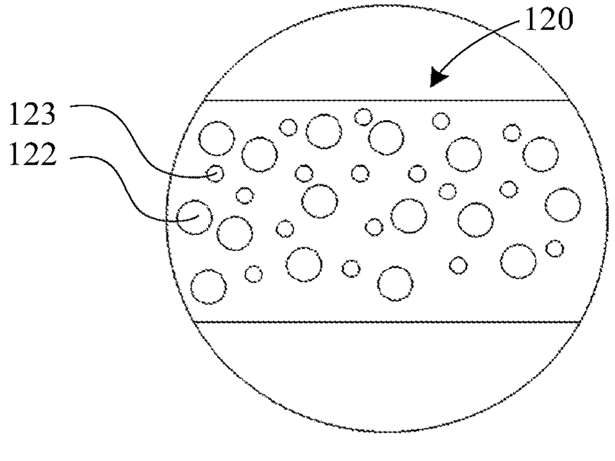
FIG. 1B is a schematic partially-enlarged diagram of the region C in FIG. 1A.

FIG. 1A is a schematic structural diagram of a liquid crystal display device 100 according to some embodiments of the disclosure and FIG. 1B is a schematic partially-enlarged diagram of the region C in FIG. 1A, the liquid crystal display device 100 includes: a quantum dot film 120, an optical film group 130 and a backlight source 110. The backlight source 110 includes an LED chip 111 configured to generate the light of first wavelength and a fluorescent layer 112 arranged at the light-emitting side of the LED chip 111. The fluorescent layer 112 is configured to be excited by the light of first wavelength generated by the LED chip 111 to generate the light of second wavelength. The light of first wavelength and the light of second wavelength emitted from the backlight source 110 is incident onto the light incident surface 121 of the quantum dot film 120. The quantum dot film 120 includes the first quantum dot material 122 and the second quantum dot material 123. The light of first wavelength excites the first quantum dot material 122 to generate the light of third wavelength, the light of first wavelength and the light of second wavelength excite the second quantum dot material 123 to generate the light of fourth wavelength, and a portion of the light of first wavelength, the light of third wavelength and the light of fourth wavelength is emitted from the quantum dot film 120 to the optical film group 130. The light of third wavelength and the light of second wavelength are in the waveband range of light in same color, and the third wavelength is shorter than the second wavelength.

Figure 2:
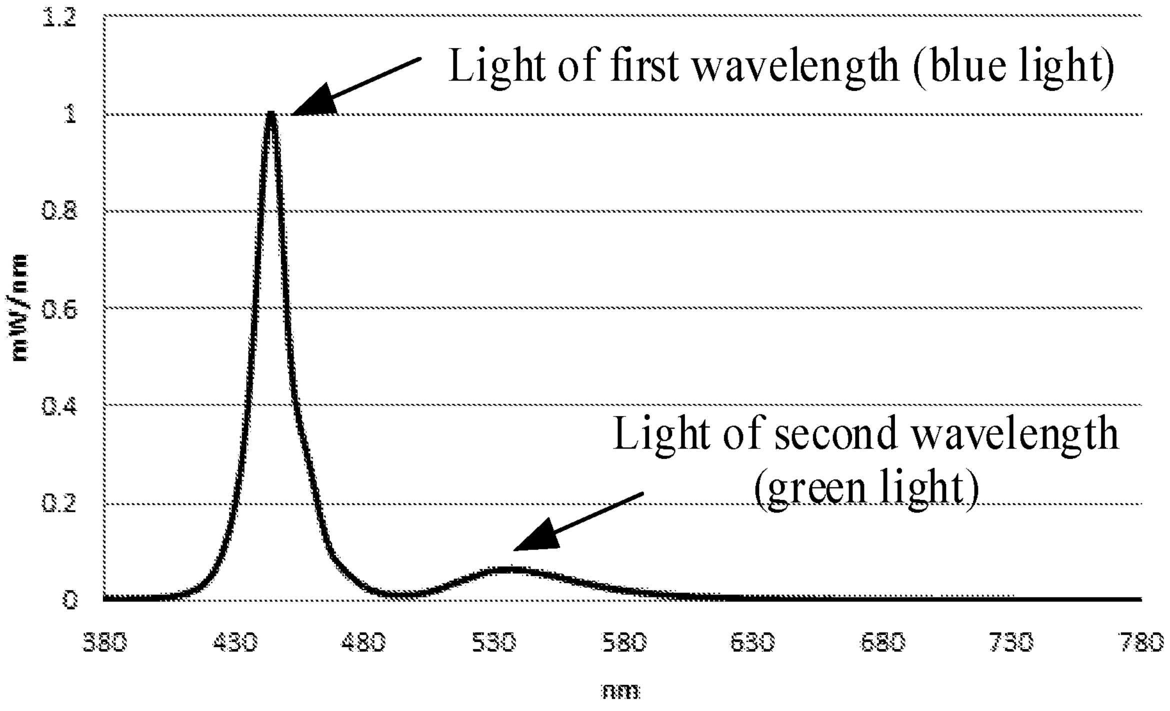
FIG. 2 is a schematic diagram of the emission spectrum of the backlight source in accordance with some embodiments of the disclosure.

In an embodiment, the light of first wavelength is the blue light, the light of second wavelength and the light of third wavelength are the green light, and the light of fourth wavelength is the red light. The LED chip 111 in the backlight source 110 is a blue light chip and is configured to generate blue excitation light when powered on, where the peak wavelength of the blue excitation light is within the range of [440 nm, 470 nm]. Here and in this disclosure, "nm" may refer to nanometer, i.e., $10^{-9}$ meter. The green fluorescent powder is encapsulated in the fluorescent layer 112, and the blue excitation light excites the green fluorescent layer to generate the green light of second wavelength, whose peak wavelength is within the range of [534 nm, 540 nm]. The blue excitation light and the green light of second wavelength emit from the backlight source 110, and go onto the light incident surface 121 of the quantum dot film 120. The first quantum dot material 122 in the quantum dot film 120 is the green quantum dot material, and generates the green light of third wavelength after being excited by the blue excitation light, where the peak wavelength of the green light of third wavelength is within the range of [528 nm, 533 nm]. The second quantum dot material 123 in the quantum dot film 120 is the red quantum dot material. As shown in FIG. 2, FIG. 2 is a schematic diagram of the emission spectrum of the backlight source 110 in accordance with the embodiments as shown in FIGS. 1A and 1B. Here and in this disclosure, "[A, B]" may refer to a range between A and B, inclusive.

Figure 3:
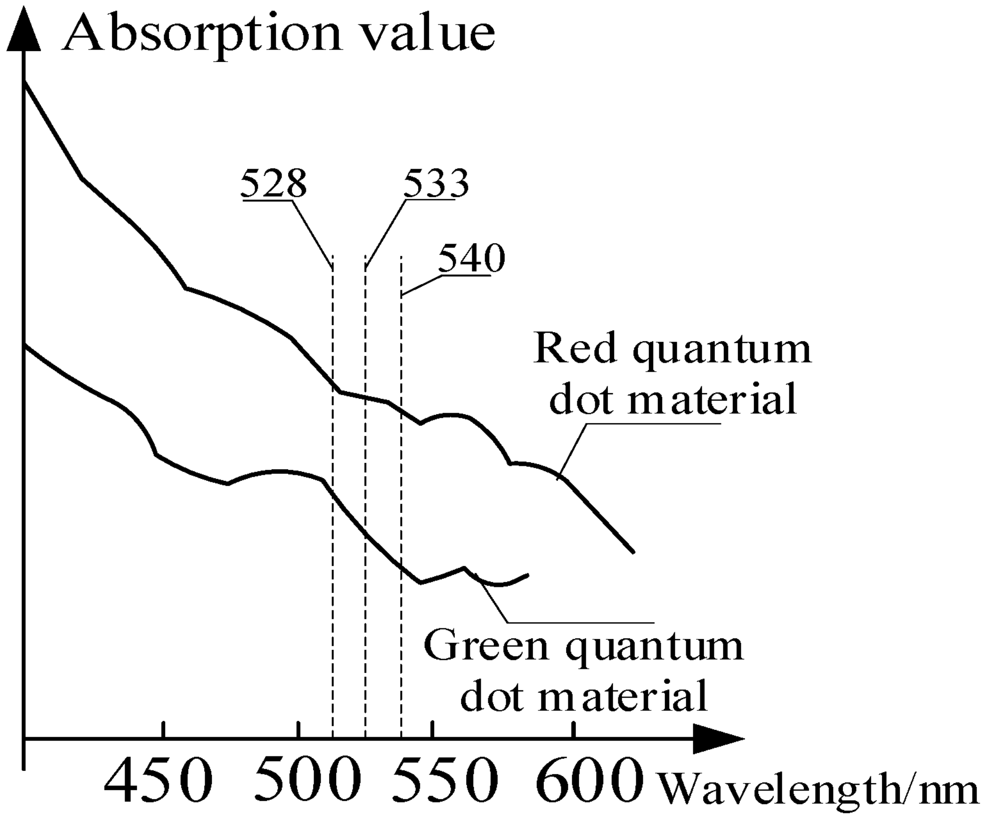
FIG. 3 is a schematic diagram of the absorption values of the red and green quantum dot materials for the lights of different wavelengths in accordance with some embodiments of the disclosure.

The quantum dot material emits light which has a certain full width at half maxima, and can be excited by the light whose wavelength is shorter than the wavelength of the quantum dot material. FIG. 3 is a schematic diagram of the absorption values of the red and green quantum dot materials for the lights of different wavelengths. Since wavelength in the full width at half maxima of the green quantum dot material is longer than that of the blue excitation light, the blue excitation light can excite the green quantum dot material to generate the green light of third wavelength. Further, compared with the red quantum dot material, the blue excitation light and the green light of second wavelength are both in the low band shorter than wavelength in the FWHM of the red quantum dot material, so the red quantum dot material can be excited by the blue excitation light and the green light of second wavelength to generate the red light. Since the third wavelength is shorter than the second wavelength, the exciting conversion rate of the green light of third wavelength excited by the green light of second wavelength is very low, so that the absorptivity of the green quantum dot material for the green light of second wavelength is reduced. Most of the green light of second wavelength is emitted from the quantum dot film 120, to increase the light-emitting rate of the green light. Under the premise of meeting the chromaticity coordinates, the light-emitting rate required by the high color gamut can be achieved without the additionally increasing the concentration of the green quantum dot material, thus reducing the usage amount of the quantum dot material and manufacture cost.

In an embodiment, the ratio of peak intensity of the first wavelength light to peak intensity of the second wavelength light is within the range of [1:0.05, 1:0.08]. The peak intensity refers to the maximum value of the luminance intensity or radiant power in the spectrum. A large number of experiments and tests demonstrate that, when the power of the LED chip 111 and the quantum dot film 120 have been determined, the light emitting from the quantum dot film 120 may enhance the viewing experience of the user by adjusting the usage amount of the green fluorescent powder, measuring the peak intensities of the blue light and the green light of second wavelength emitting from the backlight source 110 and controlling the ratio of peak intensities of the blue light to the green light of second wavelength to be within the range of [1:0.05, 1:0.08]. In this way, the ratio of peak intensity of the red light to peak intensity of the green light of third wavelength emitting from the quantum dot film 120 generally is within the range of [1:0.45, 1:0.8]. Compared with the case in the related art that the ratio of peak intensity of the red light to peak intensity of the green light is between 1:0.91:1.1, the usage amount of the green quantum dot material is reduced and the color gamut can be further increased while meeting the standard requirement of the chromaticity coordinates.

EXAMPLE 1

Figure 4A:
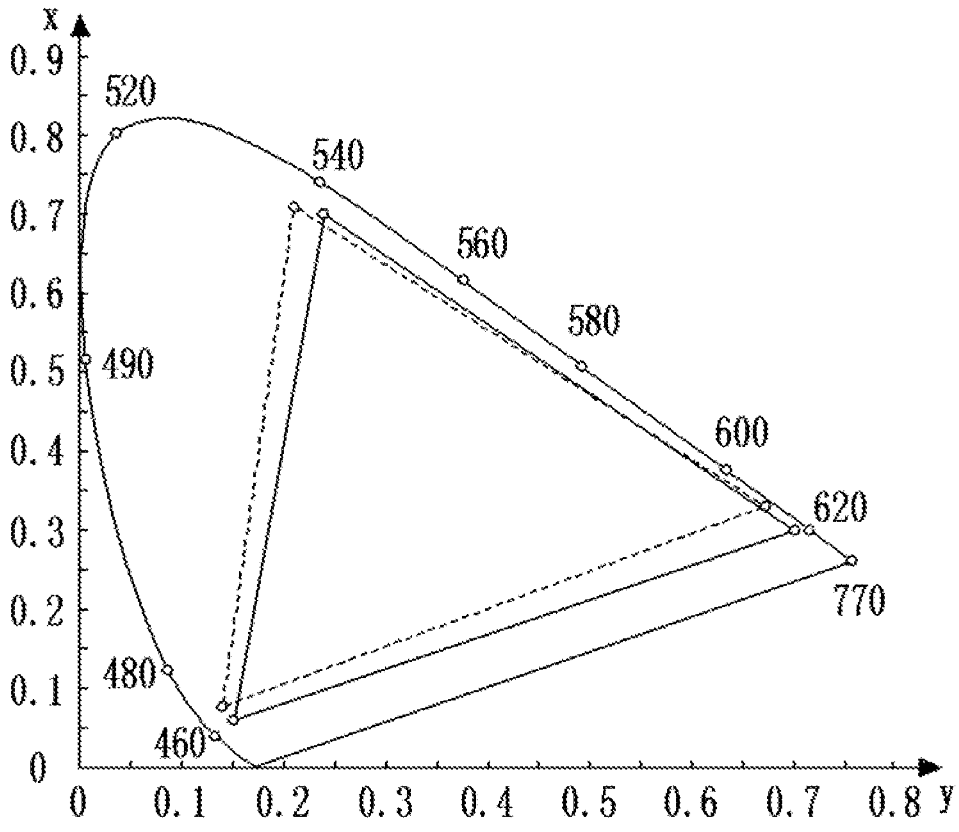
FIG. 4A is a schematic diagram of the color gamut formed by the liquid crystal display device in accordance with the first example in some embodiments of the disclosure.

FIG. 4A is a schematic diagram of the color gamut formed by a liquid crystal display device in accordance with the embodiments as shown in FIGS. 1A and 1B, wherein the standard color gamut is indicated by a solid triangle formed by solid lines, and the color gamut formed in the example 1 is indicated by a dashed triangle formed by dashed lines. When the peak wavelength of the blue light is selected as 450 nm, the peak wavelength of the green fluorescent powder is selected as 535 nm, the peak wavelength of the green quantum dot material is selected as 531 nm, the peak wavelength of the red quantum dot material is selected as 625 nm, and the usage amount of the green fluorescent powder is controlled so that the ratio of peak intensity of the blue light to peak intensity of the green light of second wavelength emitting from the backlight source 110 is 1:0.05, as shown in FIG. 4A, the red, green and blue coordinates of the liquid crystal display device are R (0.6923, 0.2974), G (0.2397, 0.6901) and B (0.151, 0.0602) respectively. In this way, the ratio of peak intensity of the red light to peak intensity of the green light of third wavelength emitting from the quantum dot film 120 is about 1:0.8, and the color gamut coverage can be achieved to about 101% of NTSC color gamut.

EXAMPLE 2

Figure 4B:
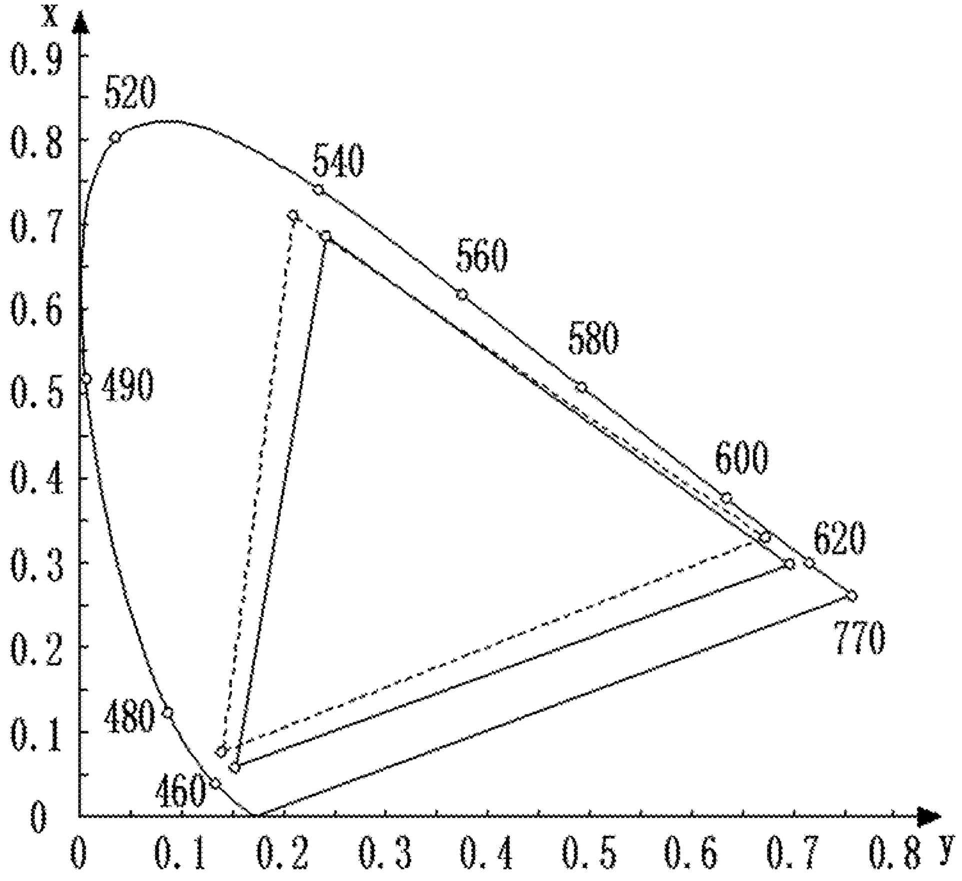
FIG. 4B is a schematic diagram of the color gamut formed by the liquid crystal display device in accordance with the second example in some embodiments of the disclosure.

FIG. 4B is a schematic diagram of the color gamut formed by a liquid crystal display device in accordance with the embodiments as shown in FIGS. 1A and 1B, wherein the standard color gamut is indicated by a solid triangle formed by solid lines, and the color gamut formed in the example 2 is indicated by a dashed triangle formed by dashed lines. When the peak wavelength of the blue light is selected as 450 nm, the peak wavelength of the green fluorescent powder is selected as 535 nm, the peak wavelength of the green quantum dot material is selected as 531 nm, the peak wavelength of the red quantum dot material is selected as 625 nm, and the usage amount of the green fluorescent powder is controlled so that the ratio of peak intensity of the blue light to peak intensity of the green light of second wavelength emitted from the backlight source 110 is 1:0.06, as shown in FIG. 4B, the red, green and blue coordinates of the liquid crystal display device are R (0.6912, 0.298), G (0.2408, 0.874) and B (0.1506, 0.0644) respectively. In this way, the ratio of peak intensity of the red light to peak intensity of the green light of third wavelength emitting from the quantum dot film 120 is about 1:0.6, and the color gamut coverage can be achieved to about 100% NTSC color gamut.

EXAMPLE 3

Figure 4C:
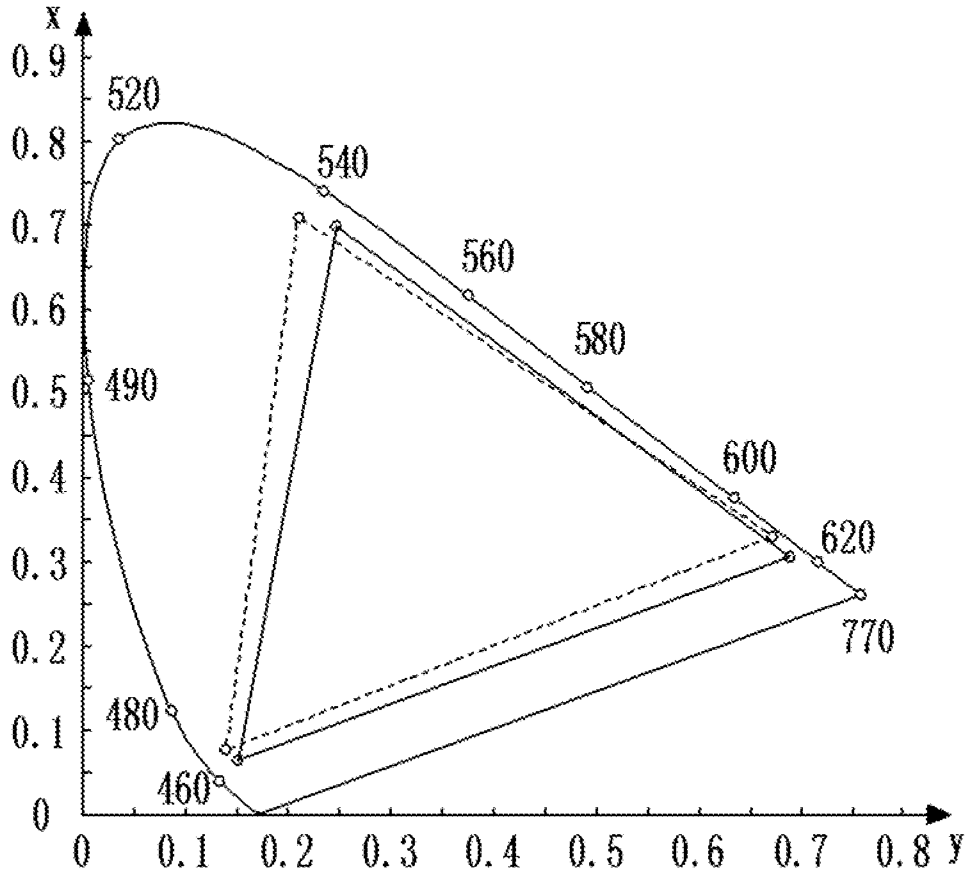
FIG. 4C is a schematic diagram of the color gamut formed by the liquid crystal display device in accordance with the third example in some embodiments of the disclosure.

FIG. 4C is a schematic diagram of the color gamut formed by a liquid crystal display device in accordance with the embodiments as shown in FIGS. 1A and 1B, wherein the standard color gamut is indicated by a solid triangle formed by solid lines, and the color gamut formed in the example 3 is indicated by a dashed triangle formed by dashed lines. When the peak wavelength of the blue light is selected as 450 nm, the peak wavelength of the green fluorescent powder is selected as 535 nm, the peak wavelength of the green quantum dot material is selected as 531 nm, the peak wavelength of the red quantum dot material is selected as 625 nm, and the usage amount of the green fluorescent powder is controlled so that the ratio of peak intensity of the blue light to peak intensity of the green light of second wavelength emitting from the backlight source 110 is 1:0.08, as shown in FIG. 4C, the red, green and blue coordinates of the liquid crystal display device are R (0.6856, 0.3002), G (0.2445, 0.6855) and B (0.1509, 0.0646) respectively. In this way, the ratio of peak intensity of the red light to peak intensity of the green light of third wavelength emitting from the quantum dot film 120 is about 1:0.5, and the color gamut coverage can be achieved to about 98% NTSC color gamut.

Figure 5:
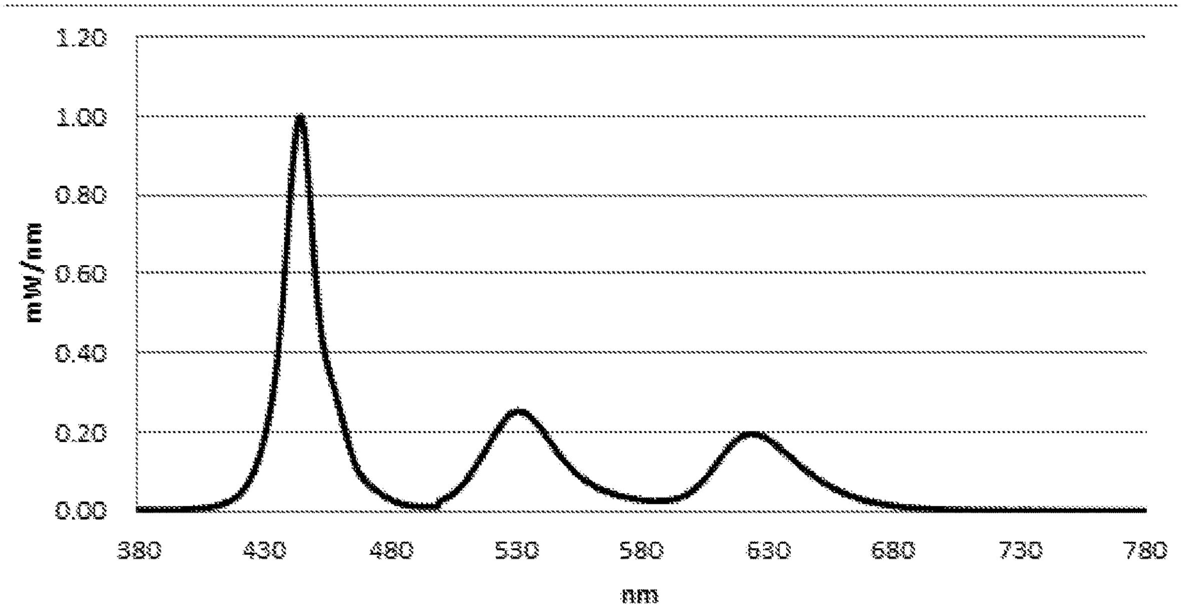
FIG. 5 is a schematic diagram of the spectrum emitted by the quantum dot film 120 in accordance with some embodiments of the disclosure.

In example 2, when the ratio of peak intensity of the blue light to peak intensity of the green light of second wavelength emitting from the backlight source 110 is 1:0.06, the schematic diagram of the spectrum emitting from the quantum dot film 120 is as shown in FIG. 5.

It should be noted that the structure of the liquid crystal display device in accordance with the above-mentioned embodiments of the disclosure is not limited to the edge-lit structure. The liquid crystal display devices with other light incident manners are all in the protection scope of the disclosure if they apply the schemes claimed by the disclosure.

Compared with the related art, the advantages of the above embodiments of the disclosure are as follows.

The liquid crystal display device in accordance with the above embodiments of the disclosure includes the quantum dot film and the backlight source. The backlight source includes the LED chip configured to generate the light of first wavelength and the fluorescent layer arranged at the light-emitting side of the LED chip. The blue light generated by the LED chip excites the fluorescent layer to generate the light of second wavelength. The quantum dot film includes the red and green quantum dot materials. The blue light generated by the LED chip excites the green quantum dot material to generate the light of third wavelength. Since the third wavelength is shorter than the second wavelength, the exciting conversion rate of the light of third wavelength excited by the light of second wavelength is reduced. But the light of second wavelength and the light of third wavelength are in the band range of the same green light, so that the exciting conversion of the green quantum dot material by the green light of second wavelength is reduced without increasing the concentration of the green quantum dot material in the quantum dot film. Then the amount of the green light of third wavelength generated by exciting the green quantum dot material decreases, that is, the secondary exciting conversion of the red quantum dot material by the green light of third wavelength is reduced. Furthermore, a large part of the green light of second wavelength generated by the fluorescent layer emits directly from the quantum dot film, and a small part thereof is used to excite the red quantum dot material. In this way, under the premise of meeting the chromaticity coordinates, the light-emitting rate required by the high color gamut can be achieved without additionally increasing the concentration of the green quantum dot material, thus reducing the usage amount of the quantum dot material and manufacture cost.

Figure 6:
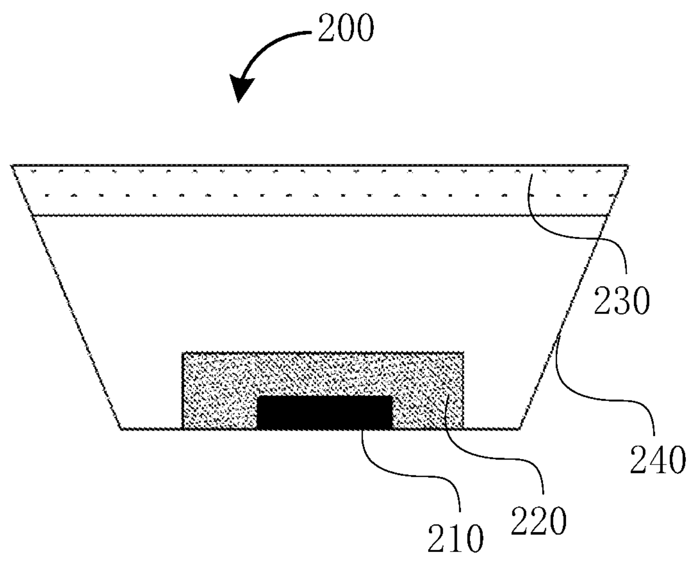
FIG. 6 is a schematic structural diagram of a quantum dot LED in accordance with some embodiments of the disclosure.

Some embodiments of the disclosure further provide a quantum dot LED 200, the schematic structural diagram can be as shown in FIG. 6. The quantum dot LED 200 includes: a support 240 with a cavity arranged therein, a quantum dot layer 230 arranged on the top of the cavity, an LED chip 210 configured to generate the light of first wavelength, and a fluorescent layer 220 arranged at the light-emitting side of the LED chip 210. In some embodiments, the LED chip 210 and the fluorescent layer 220 are arranged inside the cavity of the support 240. The fluorescent layer 220 is configured to be excited by the light of first wavelength to generate the light of second wavelength. In some embodiments, the LED chip is arranged on the bottom of the cavity, and the fluorescent layer is arranged between the LED chip and the quantum dot layer.

The quantum dot layer 230 includes a first quantum dot material and a second quantum dot material. The light of first wavelength excites the first quantum dot material to generate the light of third wavelength, the light of first wavelength and the light of second wavelength excite the second quantum dot material to generate the light of fourth wavelength, and a portion of the light of first wavelength, the light of third wavelength and the light of fourth wavelength emit from the light-emitting side of the quantum dot layer 230.

Here, the third wavelength and the second wavelength are in the wavelength range of the green light, and the third wavelength is shorter than the second wavelength.

Since the optical functions and effects of the LED chip, fluorescent layer and quantum dot layer of the embodiment as shown in FIG. 6 are similar to those in the liquid crystal display device 100 in accordance with the embodiments as shown in FIGS. 1A and 1B, the detailed description thereof will be omitted here.

Some embodiments of the disclosure further provide a liquid crystal display device which includes the quantum dot LED 200 in accordance with the embodiment as shown in FIG. 6. The functions and effects of the quantum dot LED 200 have been illustrated in details in the above embodiments, and will be omitted here.

The above specific embodiments illustrate the objects, embodiments and advantages of the disclosure in details. It should be understood that the above description is only for illustrating the specific embodiments of the disclosure but not intended to limit the scope of the disclosure, and any modifications, equivalents, improvements and others made within the spirit and principle of the disclosure shall fall within the scope of the disclosure.

What is claimed is:

1. A liquid crystal display device, comprising:

a backlight source comprising a Light Emitting Diode (LED) chip and a fluorescent layer arranged at a light-emitting side of the LED chip, the LED chip configured to generate light of first wavelength, the fluorescent layer configured to be excited by the light of first wavelength to generate light of second wavelength;

a quantum dot film comprising a first quantum dot material and a second quantum dot material, the first quantum dot material configured to be excited by the light of first wavelength to generate light of third wavelength, the second quantum dot material configured to be excited by the light of first wavelength and the light of second wavelength to generate light of fourth wavelength; and an optical film group, wherein a portion of the light of first wavelength, the light of third wavelength and the light of fourth wavelength emits from the quantum dot film to the optical film group.

2. The liquid crystal display device according to claim 1, wherein:

the light of first wavelength is blue light;

the light of second wavelength and the light of third wavelength are green light;

the light of fourth wavelength is red light;

the fluorescent layer is a green fluorescent layer;

the first quantum dot material is green quantum dot material; and the second quantum dot material is red quantum dot material.

3. A quantum dot Light Emitting Diode (LED), comprising:

a support with a cavity;

a quantum dot layer disposed on a top of the cavity;

an LED chip disposed on a bottom of the cavity and configured to generate light of first wavelength;

a fluorescent layer disposed between the LED chip and the quantum dot layer; and wherein:

the fluorescent layer is configured to be excited by the light of first wavelength to generate light of second wavelength, the quantum dot layer comprises a first quantum dot material and a second quantum dot material, the first quantum dot material is configured to be excited by the light of first wavelength to generate light of third wavelength, the second quantum dot material is configured to be excited by the light of first wavelength and the light of second wavelength to generate light of fourth wavelength, and a portion of the light of first wavelength, the light of third wavelength and the light of fourth wavelength emits from a light-emitting side of the quantum dot layer, and the light of third wavelength and the light of second wavelength have same color, and the third wavelength is shorter than the second wavelength.

4. The quantum dot LED according to claim 3, wherein:

the light of first wavelength is blue light;

the light of second wavelength and the light of third wavelength are green light;

the light of fourth wavelength is red light;

the fluorescent layer is a green fluorescent layer;

the first quantum dot material is green quantum dot material; and the second quantum dot material is red quantum dot material.

5. A liquid crystal display device, comprising:

a quantum dot Light Emitting Diode (LED) comprising:

a support with a cavity;

a quantum dot layer disposed on a top of the cavity;

an LED chip disposed on a bottom of the cavity and configured to generate light of first wavelength;

a fluorescent layer disposed between the LED chip and the quantum dot layer; and wherein:

the fluorescent layer is configured to be excited by the light of first wavelength to generate light of second wavelength;

the quantum dot layer comprises a first quantum dot material and a second quantum dot material, the first quantum dot material is configured to be excited by the light of first wavelength to generate light of third wavelength, the second quantum dot material is configured to be excited by the light of first wavelength and the light of second wavelength to generate light of fourth wavelength, and a portion of the light of first wavelength, the light of third wavelength and the light of fourth wavelength emits from a light-emitting side of the quantum dot layer;

the light of third wavelength and the light of second wavelength have same color, and the third wavelength is shorter than the second wavelength.

6. The liquid crystal display device according to claim 5, wherein:

a ratio of a peak intensity of the light of first wavelength to a peak intensity of the light of second wavelength is within a range of [1:0.05, 1:0.08]; and the peak intensity comprises a maximum value of a luminance intensity or radiant power in a spectrum.

7. The liquid crystal display device according to claim 5, wherein:

the second wavelength is within a range of [534 nm, 540 nm]; and the third wavelength is within a range of [528 nm, 533 nm].

8. The liquid crystal display device according to claim 5, wherein the fluorescent layer comprises green fluorescent powder.

9. The liquid crystal display device according to claim 5, wherein the first wavelength is within a range of [440 nm, 470 nm].

10. The liquid crystal display device according to claim 5, wherein:

the first quantum dot material is a green quantum dot material; and the second quantum dot material is a red quantum dot material.

11. The liquid crystal display device according to claim 5, wherein:

the light of first wavelength is blue light;

the light of second wavelength and the light of third wavelength are green light;

the light of fourth wavelength is red light;

the fluorescent layer is a green fluorescent layer;

the first quantum dot material is green quantum dot material; and the second quantum dot material is red quantum dot material.

12. The liquid crystal display device according to claim 11, wherein:

a ratio of a peak intensity of the light of first wavelength to a peak intensity of the light of second wavelength is within a range of [1:0.05, 1:0.08]; and the peak intensity comprises a maximum value of a luminance intensity or radiant power in a spectrum.

13. The liquid crystal display device according to claim 11, wherein:

the second wavelength is within a range of [534 nm, 540 nm]; and the third wavelength is within a range of [528 nm, 533 nm].

14. The liquid crystal display device according to claim 11, wherein the fluorescent layer comprises green fluorescent powder.

15. The liquid crystal display device according to claim 11, wherein the first wavelength is within a range of [440 nm, 470 nm].

* * * * *